United States Patent [19]
Tayama

[11] Patent Number: 5,654,704
[45] Date of Patent: Aug. 5, 1997

[54] VIDEO VARIABLE LENGTH CODE ENCODER WITH EOB INSERTION RESPONSIVE TO WORD LENGTH

[75] Inventor: Masashi Tayama, Sunnyvale, Calif.

[73] Assignee: Zapex Technologies, Incorporated, Mountain View, Calif.

[21] Appl. No.: 510,559

[22] Filed: Aug. 2, 1995

[51] Int. Cl.$^6$ .................................................. H03M 7/42
[52] U.S. Cl. .................................................. 341/67; 348/420
[58] Field of Search .................... 341/65, 67; 348/405, 348/419, 420

[56] References Cited

U.S. PATENT DOCUMENTS

| | | | |
|---|---|---|---|
| 5,148,271 | 9/1992 | Kato et al. | 348/390 |
| 5,404,168 | 4/1995 | Yamada et al. | 348/405 |
| 5,530,478 | 6/1996 | Sasaki et al. | 348/405 |

FOREIGN PATENT DOCUMENTS 7-111461  4/1995  Japan.

*Primary Examiner*—Howard L. Williams
*Attorney, Agent, or Firm*—Blakely, Sokoloff, Taylor & Zafman LLP

[57] ABSTRACT

MPEG encoded video requires the data to be variable length coded. To perform the variable length coding, most MPEG encoders use a ROM array. To reduce the cost of implementing a variable length coding unit a method of reducing the number of Read Only Memory (ROM) units required to implement the encoder is introduced. Specifically, a variable length encoder that outputs smaller incomplete variable length codes in a few rare instances. Since smaller variable length codes are output, the number of Read Only Memory (ROM) units in the Read Only Memory array can be reduced. The smaller incomplete variable length codes are later made complete using length information.

10 Claims, 6 Drawing Sheets

Figure 3a

| 0 | 0 | 0 | 0 | 0 | 0 | 0 | -3 |
|---|---|---|---|---|---|---|---|
| 0 | 0 | 0 | 0 | 1 | 0 | 0 | 0 |
| 0 | 0 | 0 | 0 | 0 | 0 | 0 | 0 |
| 0 | -1 | 0 | 0 | 0 | 0 | 0 | 0 |
| 0 | 0 | 0 | 0 | 0 | 0 | 0 | 0 |
| 2 | 0 | 1 | 0 | 0 | 0 | 0 | 0 |
| 1 | 22 | 0 | 0 | 0 | 0 | 0 | 0 |
| 10 | 0 | 0 | 0 | 0 | 0 | 0 | 0 |

VIDEO VARIABLE LENGTH CODE ENCODER WITH EOB INSERTION RESPONSIVE TO WORD LENGTH

FIELD OF THE INVENTION

The present invention relates to the compression of the amount of data necessary to reproduce a high quality of video picture. In particular, the present invention discloses an efficient method for implementing a variable length encoder for use in a digital video encoder that compresses a video signal into a digital bitstream.

BACKGROUND OF THE INVENTION

Digital video is a rapidly growing application of computer technology. However, there are difficulties associated with digital video. One of the most common difficulties is handling the large amounts of data since when an analog video signal is digitized into digital video data, the amount of digital video data produced is enormous, even for short video signals. To reduce the amount of digital data required to represent an analog video signal, compression algorithms are used. Most video compression algorithms reduce the amount of data required to represent the video by taking advantage of the redundancy between successive video frames (temporal redundancy).

The most widely used video compression systems are commonly known as MPEG-1 and MPEG-2 standards. MPEG-1 and MPEG-2 each define a compressed digital bit stream for transmitting digital video. The MPEG-1 and MPEG-2 standards are creations of the International Standards Organization's (ISO) Moving Picture Expert Group. (MPEG is an acronym for Moving Picture Expert Group).

The MPEG-1 and MPEG-2 digital video standards are currently being implemented in professional and consumer video products. In order to effectively market a consumer product that implements an MPEG standard, it is important to keep the product cost as low as possible. In accordance with this goal, it is desirable to implement MPEG encoders that use the smallest number of integrated circuits as possible.

SUMMARY OF THE INVENTION

It is therefore an object of the present invention to reduce the cost implementing a digital video encoder system. Specifically, it is a object of the present invention to reduce the cost of implementing the variable length coding unit in an MPEG encoder.

The present invention reduces the cost of implementing a variable length coding unit by reducing the number of Read Only Memory (ROM) units required to implement the encoder. Specifically, the teachings of the present invention allow the Read Only Memory array in the variable length encoder to output values that are smaller incomplete variable length codes for a few rare instances. The incomplete variable length codes are later made complete using length information.

Other objects, features and advantages of the present invention will be apparent from the accompanying drawings, and from the detailed description that follows below.

BRIEF DESCRIPTION OF THE DRAWINGS

The objects, features, and advantages of the present invention will be apparent from the following detailed description of the preferred embodiment of the invention with references to the following drawings.

FIG. 3a is an example of a quantized frequency data from a block.

DETAILED DESCRIPTION

A method and apparatus for efficiently generating and using variable length codes is disclosed. In the following description, for purposes of explanation, specific nomenclature is set forth to provide a thorough understanding of the present invention. However, it will be apparent to one skilled in the art that these specific details are not required in order to practice the present invention. For example, the present invention will be described with reference to the MPEG-2 digital video encoding standard, however the teachings of the present invention can be used in other systems that implement variable length encoding. In other instances, well known circuits and devices are shown in block diagram form in order not to obscure the present invention unnecessarily.

Figure 1:
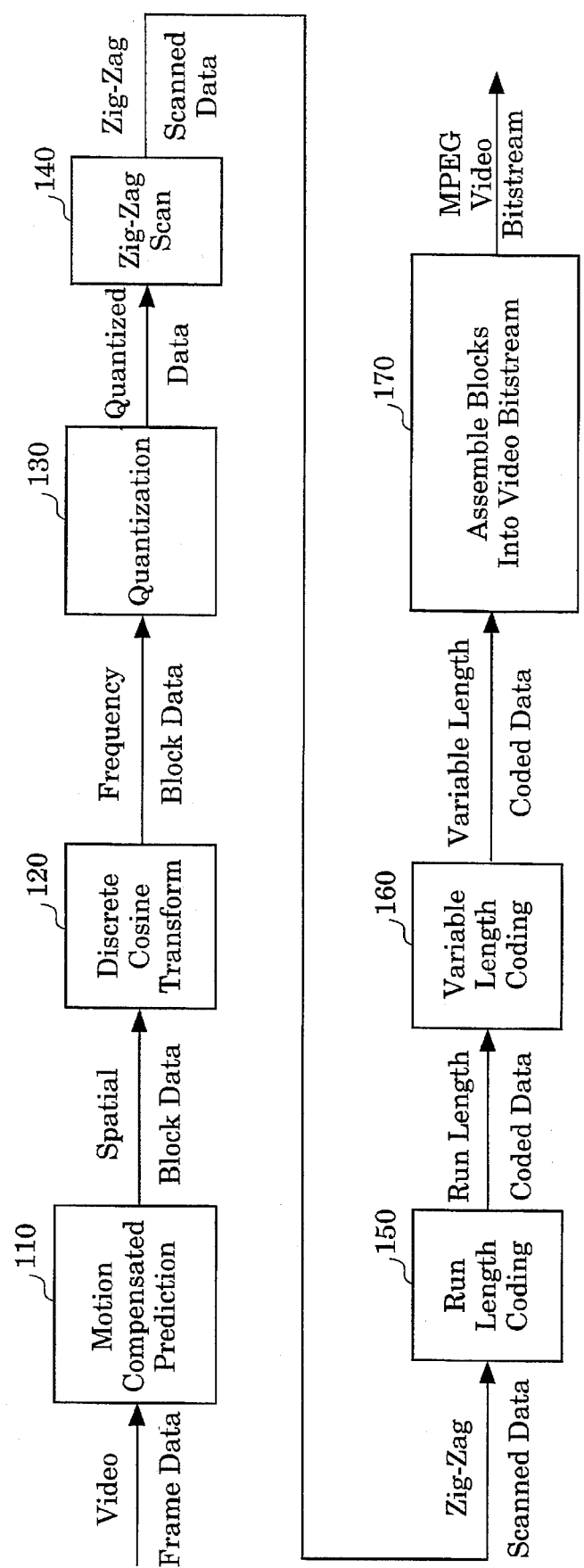
FIG. 1 illustrates a general flow diagram of the encoding process for MPEG video.
Figure 2:
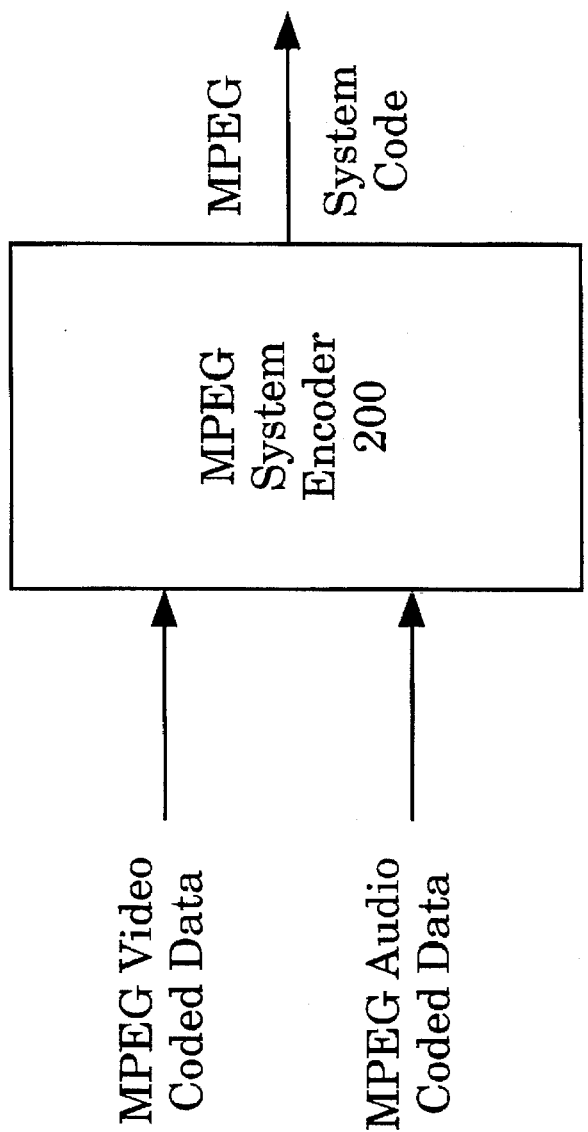
FIG. 2 illustrates a block diagram of an MPEG system encoder that combines an MPEG video bitstream and an MPEG audio bitstream into a single MPEG system bitstream.

The MPEG-2 digital video encoding standard generally divides each frame of video into 8×8 pixel blocks and encodes each block. FIG. 1 illustrates a flow diagram that lists the encoding steps performed on each block by an MPEG-2 video encoder. The encoded blocks are combined to create an encoded video frame. In a full MPEG system, the MPEG video data is combined with MPEG audio data in a MPEG system encoder 200 as illustrated in FIG. 2.

Referring again to FIG. 1, the first step (step 110) is to perform Motion compensation prediction or intra-frame encoding on the block. Motion compensation prediction is the process of determining a block in a previous or later frame that is similar to the block being analyzed in the current frame. In some flames, no motion compensation prediction is performed and the entire frame is encoded without reference to other frames. Such frames are know as intra-frames or I-frames. The output of the Motion compensation prediction or intra-frame encoding stage (step 110) is a spatial block data.

The spatial block data is then processed by a Discrete Cosine Transformer (DCT) at step 120. The Discrete Cosine Transformer changes the information from a spatial domain to a frequency domain. The output of the Discrete Cosine Transformer is frequency block data.

The frequency block data is then quantized and scanned. The quantization process, step 130, divides the frequency block coefficients by some value such that some drop bits off the bottom end. Although this process loses some information, many of the coefficients will then end up being zero such that the information can be compressed more easily. An 8×8 sample of quantized block frequency data is illustrated in FIG. 3a.

Figure 3B:
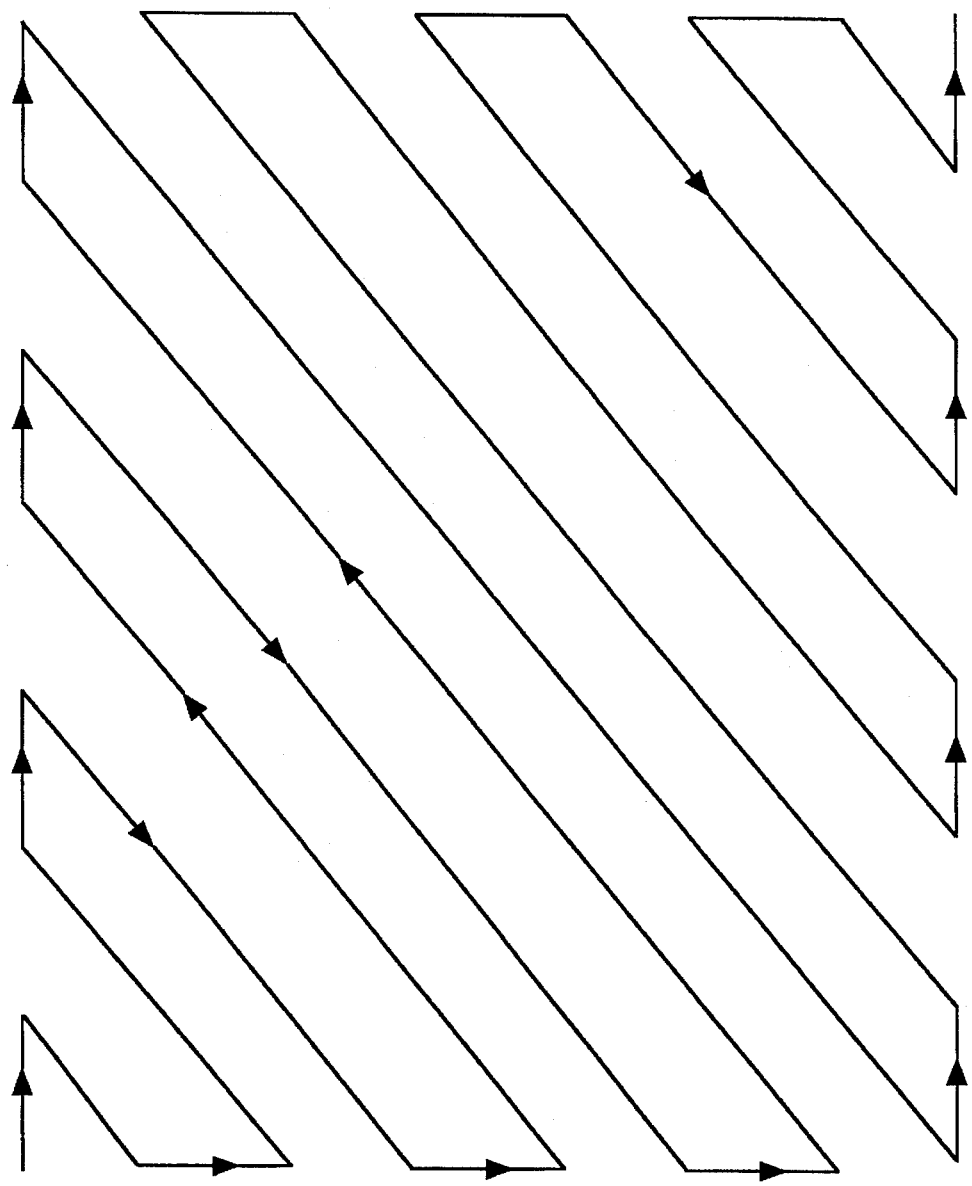
FIG. 3b is a conceptual diagram that illustrates how the quantized frequency data is scanned with a zig-zag scan.

The quantized data is then scanned using Zig-Zag scan at step 140. The Zig-Zag scan is conceptually illustrated in FIG. 3b. The Zig-Zag scan produces a long stream of quantized coefficient values that contains a strings of zeros. The string of quantized values is then processed a Run-Length Coder at step 150. The Run-Length Coder replaces the strings of zeros with a number that indicates the number of zeros (the "run-length" of zeros). The output of this step is a set of data pairs. The first value of the data pair represents the run-length of zeros between the current non-zero coefficient and previous non-zero coefficient. The other value of the pair is the level of the current non-zero coefficient. When the quantized data of FIG. 3a is Zig-Zag scanned and run-length coded, the output run-length/level pairs are as follows:

(0, 10), (0, 1), (2, 22), (0, 2), (6, 1), (3, -1), (35, 1), (10, -3)

where the first value of each pair represents the run-length of zeros and the second value of each pair represents the non-zero coefficient level.

Finally, the Run Length Coded data is put through a Variable Length Coder at step 160. The Variable Length Coder converts the run-length/level data into variable length codes wherein run-length/level pairs that appear frequently are represented by short codes and rare run-length/level pairs are represented by longer codes. If the data listed above is encoded with the ISO/IEC 13818-2 system, the output variable length codes are as follows:

| | |
|---|---|
| (0, 10): | 0000 0001 0011 0 |
| (0, 1): | 10 |
| (2, 22): | 0000 01 0000 10 0000 0001 0110 |
| (0, 2): | 0100 0 |
| (6, 1): | 0001 010 |
| (3, -1): | 0011 11 |
| (35, 1): | 0000 01 1000 11 0000 0000 0001 |
| (10, -3): | 0000 01 0010 11 1111 1111 1101 10 |

As previously stated, the most commonly occurring run-length/level pairs are coded into short codes. Other rare run-length/level combinations are converted into longer 24 bit length codes. When the final run-length/level pair for a block is reached, a special end-of-block (EOB) code must be attached. In the previous example the end-of-block code '10' is concatenated onto the last run-length/level pair.

Figure 4:
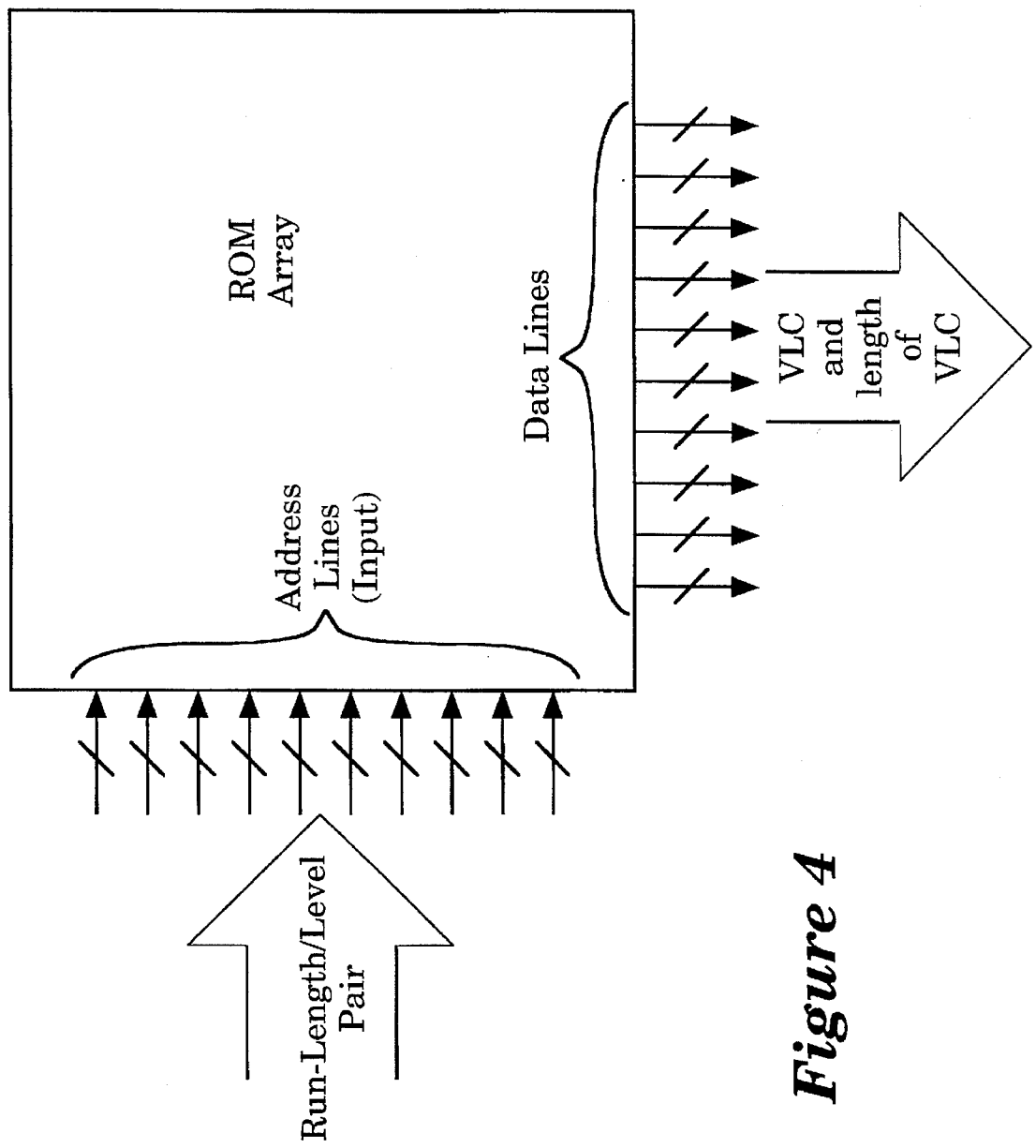
FIG. 4 is a block diagram of a ROM array being used to output variable length codes using run-length and level data as inputs.

To quickly perform the Variable Length Coding, most encoders use a specially programmed Read-Only-Memory (ROM) device. FIG. 4 illustrates a Read-Only-Memory (ROM) array that is programmed to output both the proper variable length code (VLC) and the length of the variable length code when the run-length/level pair is docked in on the address lines of the ROM.

As illustrated in FIG. 4, the Read-Only-Memory (ROM) array outputs both the length of the VLC data and the actual VLC data. To generate the VLC data defined in ISO/IEC 13818-2 as required for MPEG-2, the bit length required to represent VLC code length is 5 bits and required bit length to represent the largest VLC is 24 bits. Furthermore, if the VLC is the last VLC for an 8×8 block then the end-of-block (EOB) code must also be transmitted. Two different end-of-block (EOB) codes are used in the ISO/IEC 13818-2 standard. A first end-of-block (EOB) consists of a '10' code such that a total of 31 bits of bit width is required to represent the largest code (24 VLC bits, 5 VLC length bits, plus 2 bits of end-of-block (EOB) code). A second end-of-block (EOB) in the ISO/IEC 13818-2 standard consists of a '0110' code such that the total required bit width is lengthened to 33 bits. (24 VLC bits, 5 VLC length bits, plus 4 bits of end-of-block (EOB) code).

As previously stated, the maximum code length is 24 without an EOB code. When an EOB code is added, the maximum code length will be 26 bits if the two-bit EOB code is added to the end of the VLC code or 28 bits if the four-bit EOB code is added to the end of the VLC code. Thus, if the length of the VLC code is 26 or 28 then the VLC must be a 24 bit VLC code with an end-of-block (EOB) code added on the end. By utilizing this characteristic, the required bit width to output VLC data from the ROM array can be reduced from 26 bits or 28 bits down to 24 bits. Specifically, a 26 or 28 in the VLC length will indicate that an end-of-block (EOB) code must be added to the 24 bit VLC code. The end-of-block (EOB) code can be added at a later time.

Figure 5:
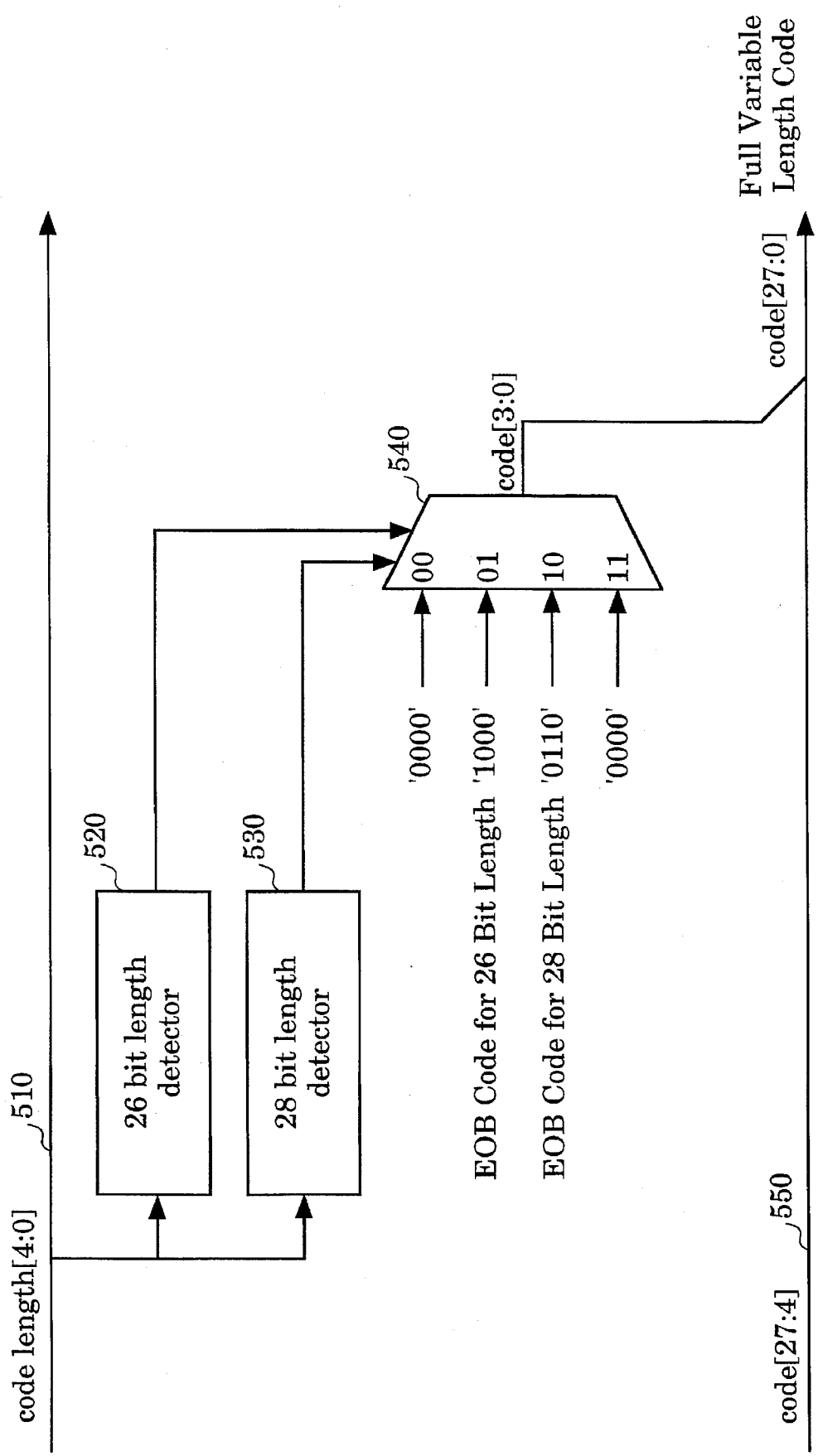
FIG. 5 is a block diagram of the encoder of the present invention that adds the extra data bits for long variable length codes.

FIG. 5 illustrates a block diagram of a combination circuit that adds then end-of-block (EOB) codes. When the code length on code length lines 510 is 26, then the output of the "26 bit length detector" 520 is active and the code '1000' is selected by the multiplexor 520. When the code length on code length lines 510 is 28, then the output of the "28 bit length detector" 530 is active and '0110' is selected by the multiplexor 520. When the code length on code length lines 510 is neither 26 nor 28, then '0000' is the output of the multiplexor 520. The four bits data output by multiplexor 520 is concatenated onto the 24 bit VLC data as the 4 least significant bits to build a full 28 bit VLC data value. Thus, employing the teachings of the circuit illustrated in FIG. 5, a 26 or 28 bit VLC code which includes EOB code can be generated without expanding VLCs stored in the ROM array to 26 or 28 bits.

By reducing the width of the VLCs stored in the ROM array, the cost of building the encoder can be reduced. Furthermore, any extra bits that are not used by the VLC can be used for another purpose. For example, the VLC codes for the first and/or last block of a frame can be marked in a manner such that they are easily identifiable by later processing stage that needs to know when frames begin and end. For example, an MPEG system encoder may need to know where each frame begins and ends such that audio data can be mixed in.

Although the present invention has been described in terms of specific exemplary embodiments, it will be appreciated that various modifications and alterations might be made by those skilled in the art without departing from the spirit and scope of the invention as set forth in the following claims.

What is claimed is:

1. A method for efficiently generating variable length codes, said method comprising the steps of:
    applying an input code to a code conversion apparatus;
    outputting a variable length code from said code conversion apparatus, said variable length code comprising an incomplete variable length code for a variable length code having a unique length;
    outputting a length value from said code conversion apparatus, said length value comprising a length of said variable length code; and
    concatenating a variable length code addendum to said variable length code if said variable length code is an incomplete variable length code, said variable length code addendum generated using said unique length.

2. The method as claimed in claim 1 wherein said code conversion apparatus comprises at least one Read Only Memory.

3. The method as claimed in claim 1 wherein said code conversion apparatus converts zero run-length/level data to ISO/IEC 13818-2 standard variable length codes.

4. The method as claimed in claim 3 wherein said variable length code addendum comprises an end of block code.

5. An apparatus for efficiently generating variable length codes, said apparatus comprising the elements of:

source data apparatus, said source data apparatus generating an input code to be converted into a variable length code;

a code conversion apparatus, said code conversion apparatus for converting said input code into a variable length code and outputting said variable length code, said variable length code comprising an incomplete variable length code for a subset of variable length codes wherein each variable length code in said subset has a unique length, said code conversion apparatus also outputting a length value comprising a length of said variable length code; and code correction apparatus, said code correction apparatus concatenating a variable length code addendum to said variable length code if said variable length code is an incomplete variable length code, said variable length code addendum generated using said unique length.

6. The apparatus as claimed in claim 5 wherein said code conversion apparatus comprises at least one Read Only Memory.

7. The apparatus as claimed in claim 5 wherein said code correction apparatus comprises a multiplexor.

8. The apparatus as claimed in claim 7 wherein an selecting input into said multiplexor comprises said length value.

9. The apparatus as claimed in claim 5 wherein said code conversion apparatus converts zero run-length/level data to ISO/IEC 13818-2 standard variable length codes.

10. The method as claimed in claim 3 wherein said variable length code addendum comprises an end of block code.

* * * * *

UNITED STATES PATENT AND TRADEMARK OFFICE
CERTIFICATE OF CORRECTION

PATENT NO. : 5,654,704
DATED : August 5, 1997
INVENTOR(S) : Masashi Tayama

It is certified that error appears in the above-identified patent and that said Letters Patent is hereby corrected as shown below:

In column 2 at line 46 delete "flames" and insert --frames--

In column 3 at line 47 delete "docked" and insert --clocked--

Signed and Sealed this

Sixteenth Day of December, 1997

Attest:

BRUCE LEHMAN

Attesting Officer

Commissioner of Patents and Trademarks